United States Patent [19]

Amagasa

[11] 4,216,514
[45] Aug. 5, 1980

[54] PROTECTIVE DEVICE FOR BRUSHLESS EXCITING DEVICE

[75] Inventor: Nobutada Amagasa, Kobe, Japan

[73] Assignee: Mitsubishi Denki Kabushiki Kaisha, Tokyo, Japan

[21] Appl. No.: 928,262

[22] Filed: Jul. 26, 1978

[30] Foreign Application Priority Data

Jul. 26, 1977 [JP] Japan .................................. 52-90181

[51] Int. Cl.² .............................................. H02H 7/06
[52] U.S. Cl. ..................................................... 361/20
[58] Field of Search ..................................... 361/20, 21

[56] References Cited

FOREIGN PATENT DOCUMENTS 1156166 10/1963 Fed. Rep. of Germany ............. 361/20
1276813  9/1968 Fed. Rep. of Germany ............. 361/20
2002777  8/1971 Fed. Rep. of Germany ............. 361/20

*Primary Examiner*—Harry E. Moose, Jr.

*Attorney, Agent, or Firm*—Oblon, Fisher, Spivak, McClelland & Maier

[57] ABSTRACT

A protective device for a brushless exciting device comprises: a signal transmitter for transmitting a signal that is applied between a neutral point of an armature winding of an AC exciting device and ground; a signal detecting circuit for detecting the signal transmitted from the signal transmitter; a signal comparator circuit for comparing the frequency of the signal taken from the signal detecting circuit with a predetermined frequency value to output a signal indicating the difference between them; and an abnormal fault detecting device which detects an abnormal fault in the output signal from the comparator and accordingly outputs a signal for the abnormal fault or indicates directly the abnormal fault. The abnormal fault detecting device may compare a pattern of the difference signal from the signal comparator circuit with predetermined signal patterns for various faults.

4 Claims, 4 Drawing Figures

PROTECTIVE DEVICE FOR BRUSHLESS EXCITING DEVICE

BACKGROUND OF THE INVENTION

1. Field of the Invention

The present invention relates to a protective device for detecting an abnormal condition or faults for the rotor of a brushless exciting device. Some of these faults are: a fault in an arm of a rectifying circuit; and the faulty grounding of an armature winding of an AC exciting device.

2. Description of the Prior Art

Heretofore, various devices have been proposed as devices for detecting an abnormal fault in a rotor of a brushless exciting device.

For example, it has been proposed to detect the fault in an arm of the rectifying circuit by a detecting winding disposed on a field pole of the AC exciting device. It has also been proposed to detect a faulty ground by measuring an insulation resistance after applying a voltage between the ground and a desired position of the electric circuit of the rotor through a slip ring.

However, a separate detecting circuit, a separate signal circuit and a separate power source circuit are required to detect all of the abnormal faults in such abnormal fault detecting device. The wirings are complicated in such a protective device and this can easily cause erroneous connection or erroneous operation and be expensive.

The kinds of faults detected by these devices are limited and sometimes, certain faults of the rotor can not be detected.

SUMMARY OF THE INVENTION

It is an object of the present invention to overcome the disadvantages of the conventional devices and to provide a protective device having simple and economical structure for detecting various abnormal faults of a brushless exciting device by outputting a frequency signal for the voltage applied between the neutral point of the armature winding of the AC exciting device and ground, and comparing this signal with a predetermined frequency value, derived when the synchronous machine is in a normal state, to detect the difference.

DETAILED DESCRIPTION OF THE PREFERRED EMBODIMENTS

Figure 1:
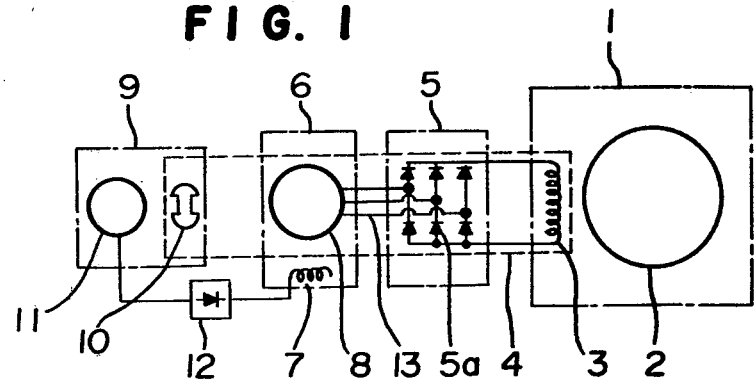
FIG. 1 illustrates a brushless exciting device for a synchronous machine.

Referring to the drawing, an embodiment for the present invention is illustrated.

FIG. 1 illustrates a brushless exciting device having a rotary rectifier.

In FIG. 1, the reference numeral (1) designates a synchronous machine; (2) designates a stator of the synchronous machine; (3) designates a field winding of the rotor of the synchronous machine; (4) designates a rotor which is directly connected to the synchronous machine and the brushless exciting device; (5) designates a rotary rectifier; (5a) designates a diode; (6) designates an AC exciting device which comprises a stator field winding (7) and a rotor armature (8); (9) designates a sub-excitor which comprises the field system (10) of a permanent magnet of the rotor and stator (11); (12) designates an automatic voltage controlling device which controls the field current of the AC exciting device (6); (13) designates a conductor connecting the armature (8) of the AC exciting device to the rotary rectifier (5).

Figure 2:
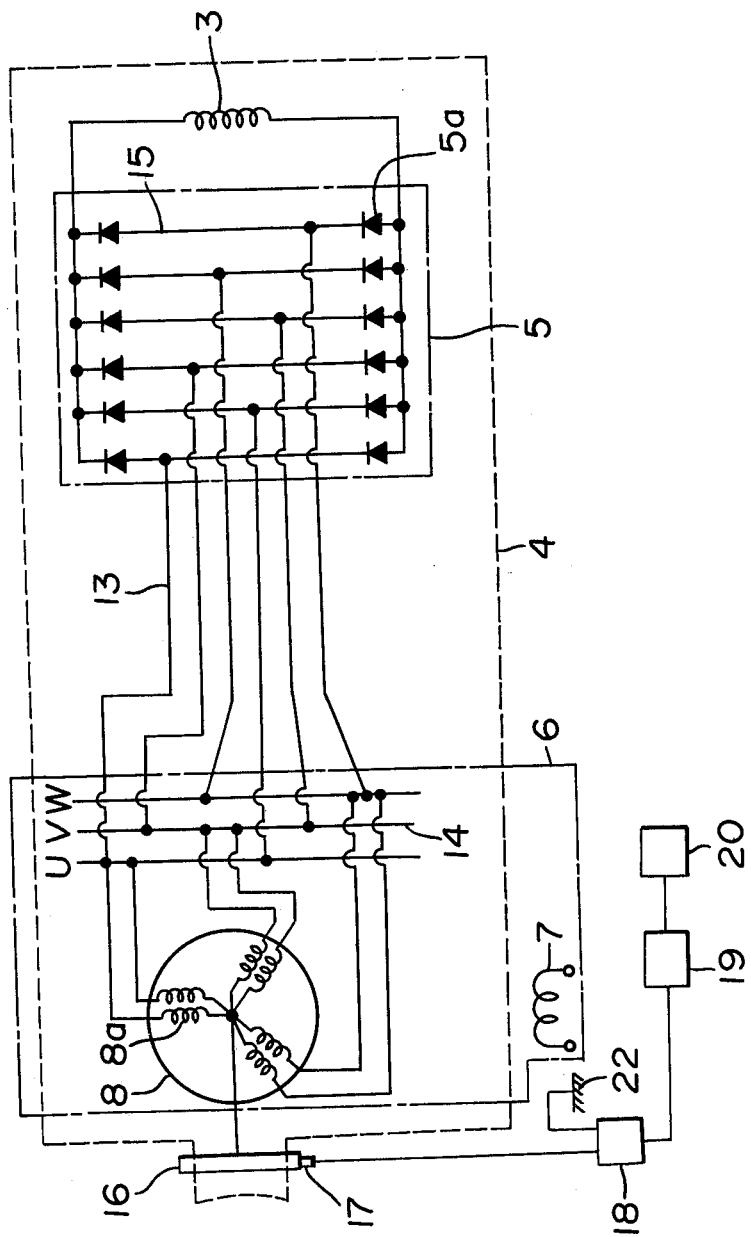
FIG. 2 illustrates one embodiment of a brushless exciting device having a protective device according to the present invention.

FIG. 2 illustrates one embodiment of the present invention. The windings (8a) of the armature (8) are in a star connection and each phase comprises two parallel circuits. The two circuits are connected by a phase ring (14). The rotary rectifier (5) takes the form of a three phase all wave connection. The connecting conductor (13) connects the phase ring (14), for each phase, to two circuits (+ side and − side) of the diode (5a). Two connecting conductors (13) for each phase are provided. In FIG. 2, the rotary rectifier (5) is shown schemmatically and a fuse (not shown) is connected in series with each diode (5a). When the rotor (4) is rotated and an exciting current is produced that passes through the field winding (7), a three phase alternating current is generated in the armature winding (8a). The alternating current is rectified by the rectifier (5) and a rectified current is produced on the field winding (3) of the synchronous machine (1).

A slip ring (16) for communicating electrical signals is attached, through an insulating material, to the shaft of the rotor (4), adjacent the AC exciting device 6, and the slip ring (16) is electrically connected to a neutral point of the armature winding (8a). A brush (17) makes contact with the slip ring (16) to transmit the signal. Consequently, a signal transmitter for transmitting an electrical signal from the rotary slip ring to the stationary brush is formed by combining the brush (17) and the slip ring (16).

A signal frequency detecting circuit (18) is connected to form a circuit connection between the brush (17) and ground (22). The detected frequency signal is inputted to a signal comparator (19) which measures the elements of the frequency signal. A gap is measured between peaks by a peak time counter and this measured value is compared with a predetermined frequency value derived when machine (1) was in a normal state. An abnormal fault detector (20) outputs a signal when an abnormal difference between the measured value and the predetermined value is detected in the output of the signal comparator (19). The abnormal fault detecting device indicates directly the abnormal fault instead of generating an output signal. However, the abnormal fault detecting device (20) can also provide an output signal as well as the direct indication of the abnormal fault.

In one embodiment having the above-described structure, the frequency of the voltage applied between the neutral point of the armature winding (8a) and ground (22) was monitored. When the brushless synchronous machine (1) was operated in the normal state, a composite of higher harmonics, with fundamental harmonics of three times the output frequency of the AC exciting device (6) was detected.

Figure 3:
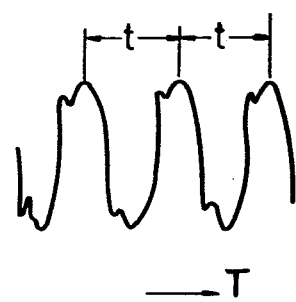
FIG. 3 shows a waveform for an input signal in a normal state, that is detected by the signal detecting circuit shown in FIG. 2.

A typical example of the detected signal is set forth in FIG. 3 wherein the waveform of the voltage applied between the netural point of the armature winding (8a) and ground, in a normal state is shown. The reference letter (T) designates a passing time and the reference letter (t) designates the gap time between peaks.

Figure 4:
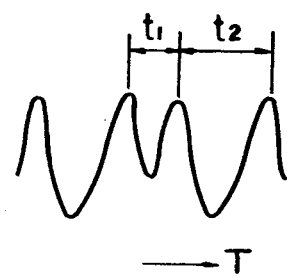
FIG. 4 shows a waveform for an input signal that will trigger an unbalanced condition in the signal detecting circuit shown in FIG. 2.

As shown in FIG. 4, when an unbalanced condition such as no current passing for one phase is caused as a result of a fault in a rectifying circuit arm, the fundamental frequency of the voltage applied between the neutral point of winding (8a) and the earth ground differs from the fundamental frequency in the normal state of FIG. 3. In FIG. 4, the reference letter (T) designates the passing time and reference letter ($t_1$) and ($t_2$), respectively, designate gap times between peaks. The fundamental signal frequency, in the normal state, is a predetermined value and the detected signal is compared with the predetermined signal to detect the abnormal fault.

The above-described embodiment typifies the case of a fault of the arm (disconnection). Thus, similar phenomena cause a disturbance of the fundamental frequency signal in the cases of: a short circuit of the rectifying circuit; a short circuit or a disconnection of each phase of the armature winding (8a) of the AC exciting device (6); or a grounding fault. The phenomenon can be detected by the protecting device of the present invention to protect it from the fault.

Moreover, when the relationship between the pattern of the faults and that of the fundamental frequency is confirmed by a calculation or a measurement and a predetermined frequency is known for each pattern, a plurality of different kinds of faults can be detected. In this case, it is effective to employ a pulse pattern discrimination method to convert the fundamental signal frequency to a corresponding pulse.

In the above-described embodiment, the slip ring and the brush are used as the electrical signal transmitter. However, it is possible to employ a contactless device for transmitting the signal from the rotary part to the stationary part of the electrical signal transmitter as follows: a rotary transformer is formed on a rotary shaft (of rotor (4)) and the neutral point of the armature winding (8a) is grounded through the rotor winding of the rotary transformer and a high resistance; and the signal is transmitted to the stator winding in the stator side of the rotary transformer.

It is also possible to connect a filter circuit to the signal detecting circuit (18) that will discriminate and only distinguish disturbances of the fundamental frequency of the signals as abnormal signals.

As described above, and in accordance with the present invention, the frequency of the signal between the neutral point of the armature winding, of the AC exciting device, and ground is detected and this signal value is compared with the aforementioned predetermined normal frequency value whereby various abnormal faults of the brushless exciting device can be detected and a protective device having simple and economical structure and high reliability is obtained.

What is claimed is:

1. In a protective device for a brushless exciting device for exciting a field winding of a synchronous machine by rectifying an output of an AC exciting device by a rotary rectifier, the improvement comprising: means for transmitting a signal between a neutral point of an armature winding of said AC exciting device and ground, said means for transmitting including a movable means and a stationary means for transmitting said signal between said neutral point of the armature winding and ground whereby said movable means rotates with the armature and said rotary rectifier; means for determining the frequency of said signal transmitted from said means for transmitting a signal, said means for determining being operatively connected between said stationary means and ground; means for comparing the frequency of said signal determined by said means for determining with a predetermined frequency value, the output signal from said means for comparing being a difference value between the frequency determined by said means for determining and the predetermined frequency value; and, means for detecting abnormalities in the difference value output signal from said means for comparing, the output from said means for detecting abnormalities bearing an indication of faults in said brushless exciting device.

2. A protective device for a brushless exciting device according to claim 1 wherein said means for detecting abnormalities is a device for comparing the frequency determined by said means for determining with predetermined signal frequencies for various faults in order to distinguish the kind of fault that is occurring.

3. A protective device for a brushless exciting device according to claim 1 wherein said means for transmitting includes: a slip ring and a brush; said slip ring being said movable means and said stationary means being said brush.

4. A protective device for a brushless exciting device according to claim 1 wherein said means for comparing includes a peak time counter for measuring the time gap between adjacent peaks of said signal.

* * * * *